(12) United States Patent
Nozaki

(10) Patent No.: US 8,860,591 B2
(45) Date of Patent: Oct. 14, 2014

(54) ANALOG DIGITAL CONVERTER

(75) Inventor: Takeshi Nozaki, Sagamihara (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/485,771

(22) Filed: May 31, 2012

(65) Prior Publication Data

US 2013/0027233 A1 Jan. 31, 2013

(30) Foreign Application Priority Data

Jul. 29, 2011 (JP) .................................. 2011-166625

(51) Int. Cl.
*H03M 1/10* (2006.01)
*H03M 1/12* (2006.01)

(52) U.S. Cl.
CPC ....................................... *H03M 1/12* (2013.01)
USPC ........... 341/120; 341/118; 341/141; 341/155; 341/159

(58) Field of Classification Search
USPC .................. 341/118, 155, 159, 120, 141, 142
See application file for complete search history.

(56) References Cited

U.S. PATENT DOCUMENTS

| | | | |
|---|---|---|---|
| 6,339,390 B1 * | 1/2002 | Velazquez et al. ............. | 341/120 |
| 6,473,013 B1 * | 10/2002 | Velazquez et al. ............. | 341/120 |
| 6,690,311 B2 * | 2/2004 | Lundin et al. .................. | 341/120 |
| 7,119,724 B1 * | 10/2006 | Asami ............................ | 341/118 |
| 7,245,638 B2 * | 7/2007 | Agazzi et al. .................. | 370/516 |
| 7,250,885 B1 * | 7/2007 | Nairn ............................. | 341/141 |
| 7,466,250 B2 * | 12/2008 | Buisson ......................... | 341/120 |
| 7,932,849 B2 * | 4/2011 | Hung et al. .................... | 341/161 |
| 8,169,350 B2 * | 5/2012 | Oshima et al. ................. | 341/120 |
| 2001/0026578 A1 | 10/2001 | Ando | |
| 2003/0128141 A1 * | 7/2003 | Asami ............................ | 341/120 |
| 2006/0176197 A1 * | 8/2006 | McNeill et al. ................ | 341/120 |
| 2007/0080835 A1 * | 4/2007 | Maeda et al. .................. | 341/120 |
| 2009/0167578 A1 * | 7/2009 | Takahashi et al. ............. | 341/120 |
| 2011/0260898 A1 * | 10/2011 | Velazquez ..................... | 341/110 |
| 2012/0235841 A1 * | 9/2012 | Gomez et al. ................. | 341/118 |

FOREIGN PATENT DOCUMENTS

| | | |
|---|---|---|
| JP | 8-172419 A | 7/1996 |
| JP | 10-22859 A | 1/1998 |

OTHER PUBLICATIONS

Shafiq M. Jamal, et al., "A 10-b 120-Msample/s Time-Interleaved Analog-to-Digital Converter With Digital Background Calibration", IEEE Journal of Solid-State Circuits, Dec. 2002, pp. 1618-1627, vol. 37, No. 12, USA.
Korean Office Action with English Translation Dated: Aug. 23, 2013.
Korean Office Action dated Apr. 10, 2014; Korean Application No. 10-2012-0071605.

* cited by examiner

*Primary Examiner* — Linh Nguyen
(74) *Attorney, Agent, or Firm* — Arent Fox LLP

(57) ABSTRACT

An ADC which samples an analog input signal at a sampling frequency and converts the analog input signal to a digital output signal, has N analog digital converter (ADC) channels which convert the analog input signal into the digital output signal by time interleaving, a channel synthesizer which synthesizes channel digital signals output respectively by the ADC channels to generate the digital output signal, an adaptive filter provided at at least one output of the ADC channels, and a correction circuit which generates a coefficient of the adaptive filter in accordance with the digital output signal. The correction circuit calculates a DC component of an image signal component, from among an analog input signal component and the image signal component corresponding to error, both being included in the digital output signal, and calculates the coefficient such that the DC component is suppressed on the basis of the DC component.

17 Claims, 12 Drawing Sheets

Δt: TIMING SKEW

ANALOG DIGITAL CONVERTER

CROSS-REFERENCE TO RELATED APPLICATION

This application is based upon and claims the benefit of priority of the prior Japanese Patent Application No. 2011-166625, filed on Jul. 29, 2011, the entire contents of which are incorporated herein by reference.

FIELD

The embodiments discussed herein is related to an ADC and a correction circuit thereof.

BACKGROUND

An analog digital converter (ADC) is a circuit which converts an analog input signal into a digital output signal. In order to raise the sampling frequency, a time-interleaved ADC has been proposed in which a plurality of ADCs (ADC channels) are provided and this plurality of ADCs convert an analog input signal into a digital output signal, successively by time division. A time-interleaved ADC is capable of high-speed operation, but the S/N ratio may decline if the characteristics of each ADC are different and/or there is deviation in the relationship between the timings at which the ADCs operate.

Foreground calibration and background calibration have been proposed as methods for correcting error between ADC channels. The former requires time for correction apart from the normal ADC operating time. The latter, on the other hand, performs correction during normal operation of the ADC, and therefore also corrects errors caused by temporal change or temperature variation, and the like, in the background.

S. M. Jamal, et. al., "A 10b 120Msample/s Time-Interleaved Analog-to-Digital Converter With Digital Background Calibration", JSSC 2002, describes an ADC which performs background calibration.

According to the background calibration circuit described above, an adaptive filter is provided in at least one of a plurality of ADC channels which operated by time-interleaving (time division), and the coefficient value of the adaptive filter is calculated on the basis of the sum output obtained by summing the outputs of the plurality of ADC channels. By controlling the coefficient value of the adaptive filter so as to suppress the spurious signal component of the summed output, it is sought to suppress the spurious signal component (error signal component, image signal component) which is error generated as a result of deviation (skew) in the sampling timings of the time interleaving method.

However, in the method described in S. M. Jamal, et. al., "A 10b 120Msample/s Time-Interleaved Analog-to-Digital Converter With Digital Background Calibration", JSSC 2002, it is not possible to suppress the spurious signal component adequately when the input signal is of a specific frequency, and this method can only be used for analog input signals of limited frequencies.

SUMMARY

A first aspect of the embodiment is an ADC which samples an analog input signal at a sampling frequency (hereinafter, fs) and converts the analog input signal to a digital output signal, having: a plurality of (N) analog digital converter (hereinafter ADC) channels which convert the analog input signal into the digital output signal by time interleaving; a channel synthesizer which synthesizes channel digital signals output respectively by the N ADC channels in order to generate the digital output signal; an adaptive filter provided at at least one output of the N ADC channels; and a correction circuit which generates a coefficient of the adaptive filter in accordance with the digital output signal, wherein the correction circuit calculates a DC component of an image signal component, from among an analog input signal component and the image signal component corresponding to error, both of which are included in the digital output signal, and calculates the coefficient such that the DC component is suppressed on the basis of the DC component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
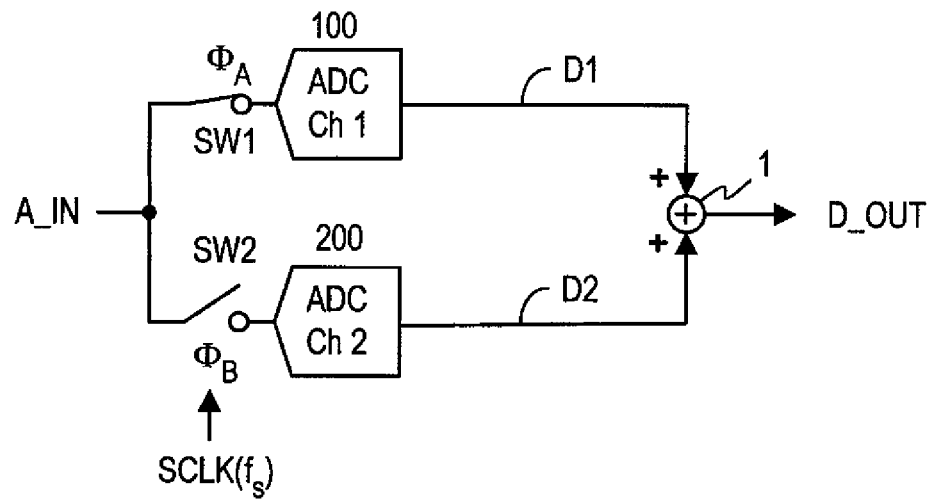
FIG. 1 is a diagram illustrating a time-interleaved type of ADC.

FIG. 1 is a diagram illustrating a time-interleaved type of ADC. The time-interleaved ADC has N ADC channels 100, 200 (where N is 2 in the example in FIG. 1) which convert the analog input signal A_IN into a digital output signal by time interleaving, and a channel synthesizer 1 which generates a digital output signal D_OUT by synthesizing the channel digital signals D1, D2 output respectively by the N ADC channels 100, 200. The channel synthesizer 1 is an adder, for example.

The analog input signal A_IN is input to the respective ADC channels 100, 200 via switches SW1, SW2. The switches SW1, SW2 repeat time-interleaved on/off switching in synchronism with the sampling clock SCLK of the sampling frequency fs. In the example in FIG. 1, there are two ADC channels, and therefore the switches SW1, SW2 switch on in synchronism with the rising edges of sampling clocks ΦA and ΦB having a frequency of fs/2 obtained by dividing the sampling clock SCLK having a sampling frequency of fs in two (into N parts according to the N channels) and the analog input signal A_IN while the respective sampling clocks ΦA and ΦB have an H level is input to the respectively corresponding ADC channels 100, 200.

The ADC channels each have an ADC circuit, which converts the input analog input signal into a digital signal. The ADC circuits of the ADC channels perform AD conversion at a cycle having a frequency of fs/2 obtained by halving the sampling clock SCLK having a sampling frequency fs in two, in other words, at a cycle of two times the sampling frequency fs.

Figure 2:
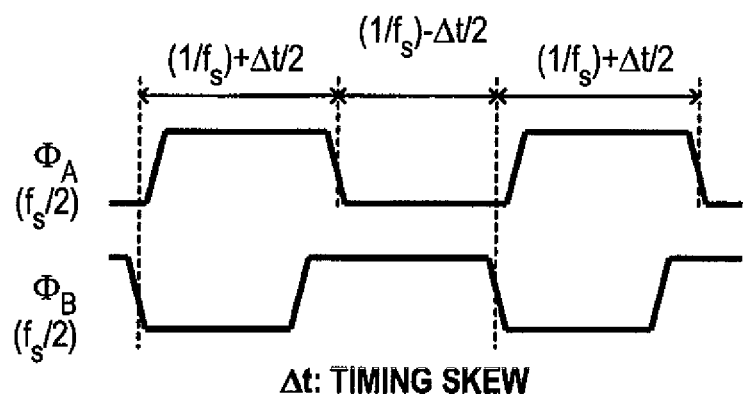
FIG. 2 is a diagram illustrating one example of the sampling clocks ΦA and ΦB obtained by halving the sampling clock.

FIG. 2 is a diagram illustrating one example of the sampling clocks ΦA and ΦB obtained by halving the sampling clock. Ideally, the on duty of the sampling clock ΦA is 50%, but as illustrated in FIG. 2, if the H-level time is 1/fs+Δt/2 and the L-level time is 1/fs−Δt/2, then the rising edge of the sampling clock ΦB, which is of opposite phase to the sampling clock ΦA, has a timing that is −Δt/2 earlier than the ideal timing 1/fs. As a result of deviation (skew) of this kind in the sampling timings of the ADC, a skew error occurs in the channel digital output signals D1, D2 obtained by AD conversion.

Figure 3:
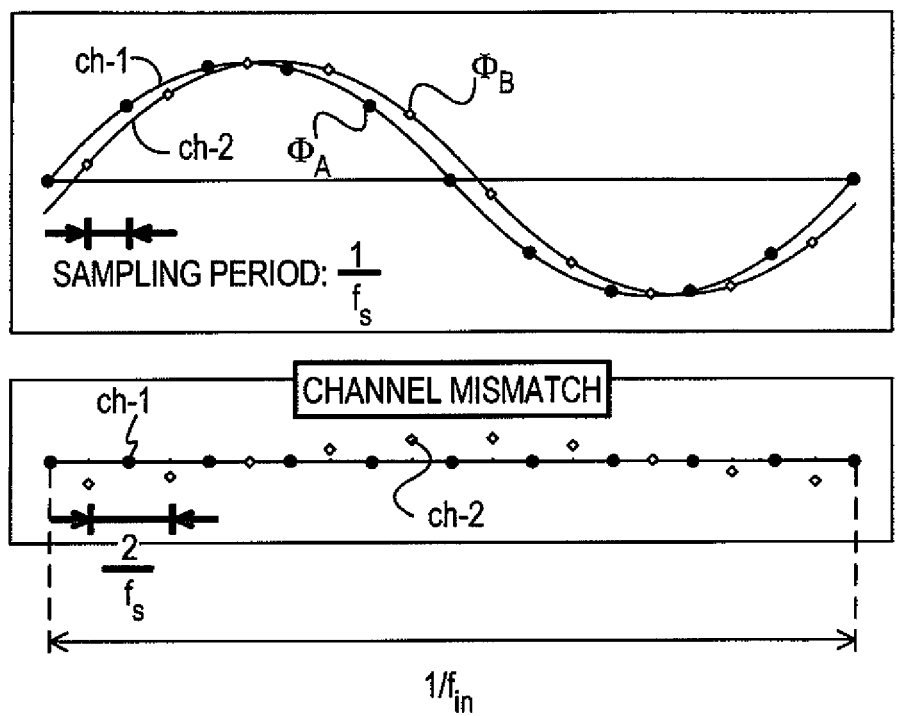
FIG. 3 is a diagram illustrating skew error.

FIG. 3 is a diagram illustrating skew error. The upper portion of FIG. 3 depicts the sampling timings and digital output signals ch-1, ch-2 obtained by AD conversion by the ADC channels 100, 200, and the lower portion of FIG. 3 depicts the error in the digital output signals ch-1, ch-2. It is presumed that the analog input signal A_IN is a sine wave or a cosine wave. If the signal is sampled at the rising edge of the first sampling clock ΦA, then the output signal obtained by AD conversion of the sampled signal has a waveform such as that indicated by ch-1 in FIG. 3. If the first sampling clock ΦA is not skewed with respect to the second sampling clock ΦB, then in contrast to the waveform illustrated in the lower portion of FIG. 3, no error occurs between the black circles which represent the signal obtained by sampling and AD conversion based on the clock ΦA and the white circles which represent the signal obtained by sampling and AD conversion based on the clock ΦB.

On the other hand, a signal which is obtained by sampling and AD conversion based on the second sampling clock ΦB which has a timing Δt/2 earlier than the 180° phase of the first sampling clock ΦA is the waveform indicated by ch-2 in FIG. 3. In other words, the waveform ch-2 has a value which is delayed by Δt/2 with respect to the value of the waveform ch-1 based on the sampling timing of the clock ΦB. Moreover, as illustrated in the lower portion of FIG. 3, error occurs in the white circles which represent the signal obtained by sampling and AD conversion based on the clock ΦB.

The difference between the two waveforms ch-1, ch-2 is skew error, which is contained in the digital output signal D_OUT obtained by synthesizing the outputs of the two ADC channels. The values obtained by sampling and AD conversion of the waveform ch-1 has zero error as indicated by the black circles, but the values obtained by sampling and AD conversion of the waveform ch-2 has an error corresponding to the difference with respect to the waveform ch-1, as indicated by the white circles. In other words, the digital output signal D_OUT includes, in addition to the analog input signal component (the value of the waveform ch-1), an image signal component (spurious component) due to the skew error which is the differential between the waveforms ch-1 and ch-2 at the sampling clock ΦB.

As indicated by the channel mismatch in the lower portion of FIG. 3, this skew error is generated at the cycle of 2/fs of the sampling clock ΦB (frequency fs/2), and is the value of an envelope curve having the cycle 1/fin of the analog input signal (the waveform of ch-1). Therefore, the image signal component is a waveform having a high frequency fs/2 which is one half of the sampling frequency fs, and a low frequency which is the frequency fin of the analog input signal (the waveform of ch-1), and the frequency of the image signal component is fs/2−fin.

Therefore, it has been proposed to provide a correction circuit which suppresses or removes an image signal component, in the background, in a time-interleaved type of ADC. For example, there is the technology described in S. M. Jamal, et. al., "A 10b 120Msample/s Time-Interleaved Analog-to-Digital Converter With Digital Background Calibration", JSSC 2002.

Figure 4:
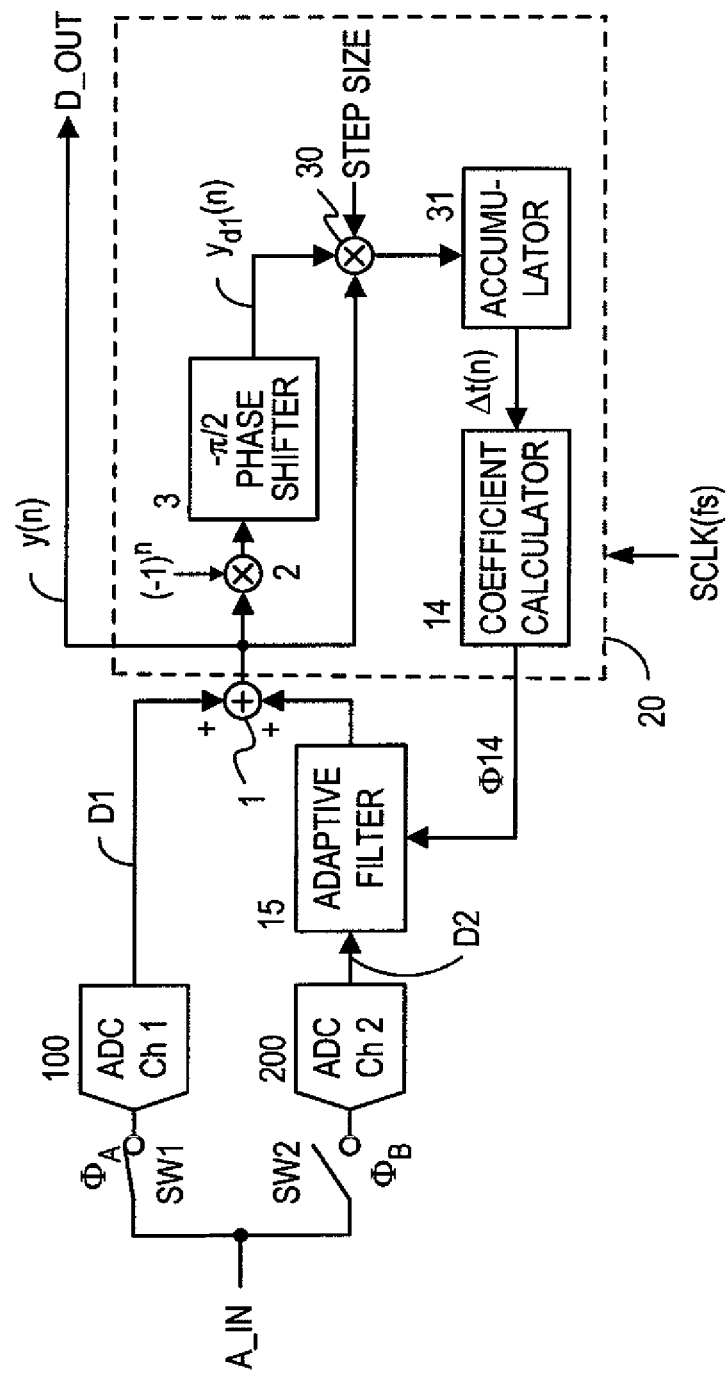
FIG. 4 is a diagram depicting an example of a time-interleaved type of ADC.

FIG. 4 is a diagram depicting an example of a time-interleaved type of ADC. This example is an ADC which performs background calibration in respect of skew error. This example is also an example where there are N=2 ADC channels 100, 200.

The ADC of time-interleaved type illustrated in FIG. 4, which is similar to that in FIG. 1, has two ADC channels 100, 200 and an adder 1 which synthesizes the digital outputs therefrom. Moreover, the ADC has an adaptive filter 15 which corrects the output from the ADC 200 of the second channel, and the ADC also has a correction circuit 20 which generates a coefficient φ14 of the adaptive filter 15 on the basis of the digital output signal D_OUT synthesized by the adder 1.

The correction circuit 20 determines an estimated skew error amount Δt(n) by calculation from the digital output signal D_OUT, and calculates a filter coefficient φ14 on the basis of this estimated amount. Here, n is the number of samples. The adaptive filter 15 corrects the digital output D2 of the second ADC channel 200 to a delayed signal value, in accordance with the filter coefficient φ14. The filter coefficient φ14 is then determined by calculating the estimated skew error amount Δt(n) again, from the digital output signal D_OUT obtained as a result of this correction. Calibration in respect of skew error is achieved by repeating this process until the estimated skew error amount Δt(n) approaches zero.

Supposing that the analog input signal A_IN is a cosine wave (a*cos(fin)) having a frequency fin and an amplitude of A/2=a, the input signal y(n) to the correction circuit 20 which is output by the adder 1 is as follows. The process of deriving this input signal y(n) is described in detail hereinafter.

$$y(n)=a\cdot\cos\alpha-b\cdot\sin\beta \quad (1)$$

$$a=A/2 \quad (2)$$

$$b=(A\cdot\omega_{in}\Delta t)/4 \propto \Delta t \quad (3)$$

Here, A, $\omega_{in}$ and Δt respectively indicate the amplitude of the analog input signal, the angular frequency of the input signal and the skew error.

The correction circuit 20 in FIG. 4 includes a frequency shift circuit 2 and a −π/2 phase shift circuit 3, and multiplies the input signal in Equation (1), y(n)=a·cos α−b·sin β, and the output signal from the phase shift circuit 3, yd(1)=a·sin β−b·cos α, in a multiplier 30, and removes the AC component in an accumulator 31, and therefore the estimated skew error amount Δt(n) is expressed by the following expression.

$$\Delta t(n)=-a\cdot b \quad (4)$$

In other words, the coefficient calculation circuit 14 calculates the coefficient φ14 in such a manner that the value −a·b approaches zero.

Figure 5:
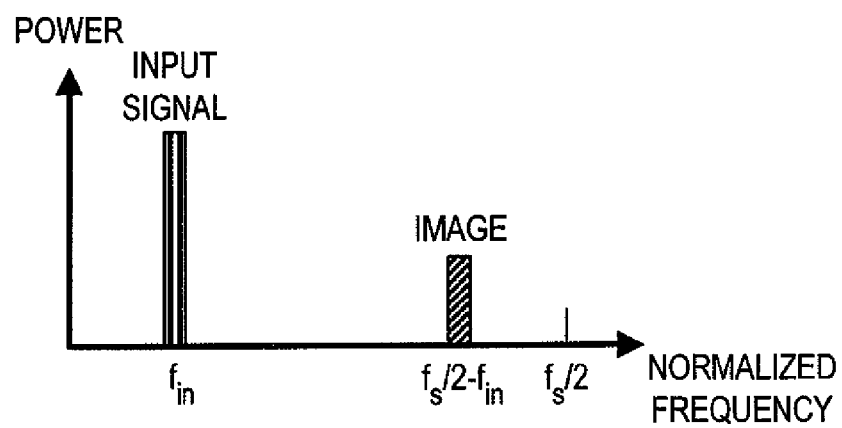
FIG. 5(1) and FIG. 5(2) are diagrams illustrating an analog input signal component and an image signal component.
Figure 5:
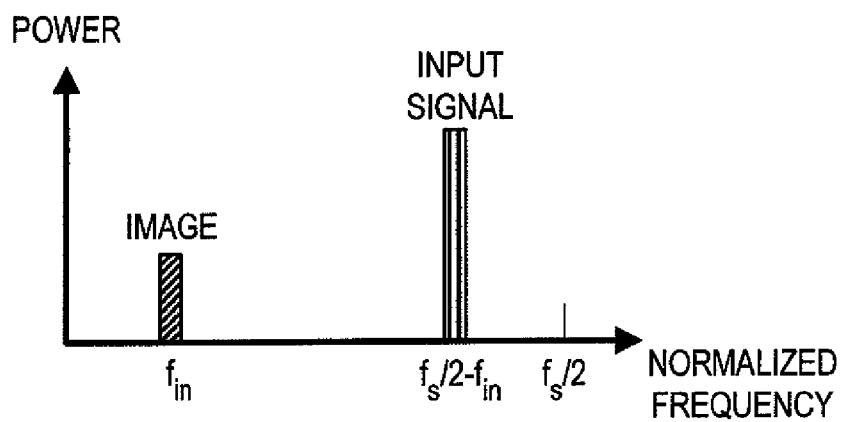

FIG. 5(1) and FIG. 5(2) are diagrams illustrating an analog input signal component and an image signal component. The analog input signal component (a·cos α) and the image signal component (−b·sin β) which is produced by skew have frequency components of fin and fs/2−fin, as in FIG. 5(1). If the frequency shift circuit 2 shifts the signal frequency by fs/2, then the frequencies of the input signal component and the image signal component will be as indicted in FIG. 5(2). In other words, the frequencies are interchanged with each other. Therefore, when the multiplier 30 multiplies the signals y(n) and yd1(n) and the accumulator 31 removes the AC component, the estimated skew error amount Δt(n) is as illustrated in Formula (4) above.

If the frequency fin of the analog input signal is other than fs/4, the frequency fin of the input signal component differs from the frequency fs/2−fin of the image signal component generated by skew error, and therefore by approximating Formula (4) to zero, it is possible to approximate the value b, which is proportional to the skew error Δt(n) in Formula (3), to zero. As a result of this, the skew error Δt(n) is made to approach zero.

However, if the frequency fin of the analog input signal is fs/4, (fin=fs/4), then the frequency characteristics of the digital output signal D_OUT are such that the analog input signal component and the image signal component have the same frequency fs/4.

Figure 6:
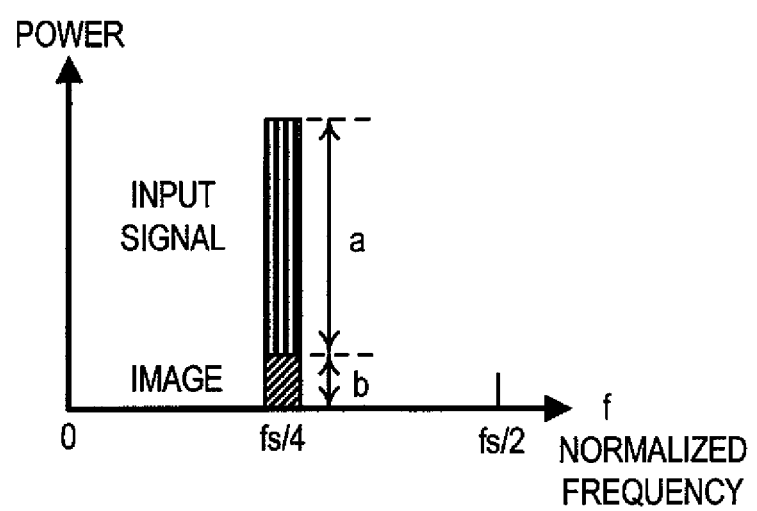
FIG. 6 is a diagram illustrating the frequency characteristics of the digital output signal D_OUT when the frequency fin of the analog input signal is fs/4 (when fin=fs/4).

FIG. 6 is a diagram illustrating the frequency characteristics of the digital output signal D_OUT when the frequency fin of the analog input signal is fs/4 (when fin=fs/4). As stated above, if fin=fs/4, then the frequency of the image signal component in FIG. 5(1) and FIG. 5(2), fs/2−fin also becomes fs/2−fin=fs/4. Therefore, it becomes impossible to distinguish between the analog input signal component a and the image signal component b. In other words, when the frequency fin of the analog input signal is fs/4, it is no longer possible to distinguish whether the processing for approximating the estimated skew correction amount Δt(n) to zero is a process of approximating the value of a in Formula (4) to zero, or a process of approximating the value of b in Formula (4) to zero. Therefore, even if there is skew error, the estimated skew correction amount Δt(n) (−a·b)=0 when the value a is approximated to zero, and the skew error is not corrected.

[First Embodiment]

Figure 7:
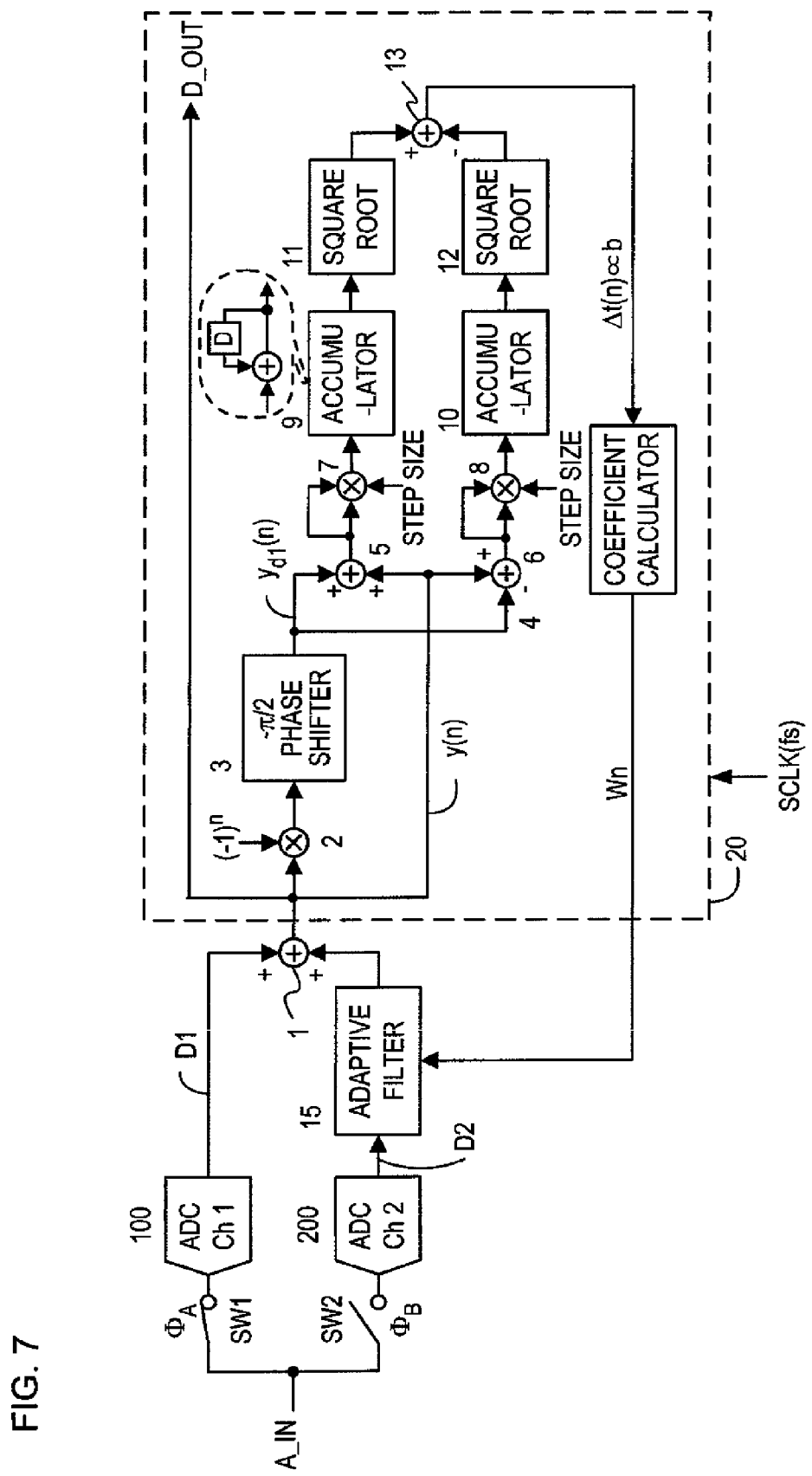
FIG. 7 is a schematic drawing of an ADC according to a first embodiment.

FIG. 7 is a schematic drawing of an ADC according to a first embodiment. This example also depicts a time-interleaved ADC, which performs background calibration of skew error. In this example as well, there are N=2 ADC channels 100, 200. Similarly to FIG. 1, the time-interleaved ADC in FIG. 7 has two ADC channels 100, 200, and an adder 1 which synthesizes the digital outputs D1, D2 therefrom. Moreover, the ADC has an adaptive filter 15 which corrects the output of the ADC 200 of the second channel, and also has a correction circuit 20 which generates a coefficient φ14 for the adaptive filter 15 on the basis of the digital output signal D_OUT synthesized by the adder 1. To here, the process is the same as that depicted in FIG. 4.

In contrast to FIG. 4, the correction circuit 20 separates the analog signal component (value a described above) and the image signal component caused by skew error (value b described above), from the digital output signal D_OUT, extracts the image signal component only, and inputs the image signal component to the coefficient calculation circuit 14 as the estimated skew error amount Δt(n). The coefficient calculation circuit 14 calculates a filter coefficient Wn which causes the estimated amount Δt(n) (proportional to value b) to approach zero. The adaptive filter 15 corrects the digital output D2 of the second ADC channel 200 in accordance with this filter coefficient Wn. Moreover, the estimated skew error amount Δt(n) is calculated again from the digital output signal D_OUT obtained as a result of the aforementioned correction, and a new filter coefficient Wn is calculated and set in the adaptive filter 15. By repeating a process of this kind until the estimated skew error amount Δt(n) (proportional to the value b) approaches zero, calibration in respect of skew error is performed.

In this way, in the ADC according to the first embodiment, the correction circuit 20 performs a calculation for separating the analog input signal component (value a) and the image signal component (value b), from the digital output signal D_OUT, and a filter coefficient Wn is generated in such a manner that an estimated skew error value Δt(n) which includes the image signal component (value b) but does not include the analog input signal component (value a) approaches zero. Consequently, even if the frequency fin of the analog input signal A_IN is equal to fs/4, it is still possible to perform reliable calibration so that the image signal component (value b) becomes zero.

A concrete calculation circuit of the correction circuit 20 according to the present embodiment is as follows. The correction circuit 20 includes a frequency shift circuit 2 which shifts the digital output signal D_OUT by fs/N (N=2 in the example), and a phase shift circuit 3 which shifts the phase of the output from the frequency shift circuit 2 by −π/2. Moreover, the correction circuit 20 has a first adder circuit 5 which adds the digital output signal (y(n)=a*cos α−b*sin β, α=fin, β=fs/2−fin) and the output signal of the phase shift circuit 3 (yd1(n)=a*sin β−b*cos α), and first subtracting circuits 4, 6 which subtract the output signal yd1(n) of the phase shift circuit 3 from the digital output signal y(n), and also includes: first and second squaring circuits 7, 8 which respectively square the output from the first adder circuit 5 and the output from the first subtracting circuits 4, 6, first and second averaging circuits 9, 10 which respectively average the outputs of the first and second squaring circuits, first and second square root circuits 11, 12 which respectively calculate the square roots (a−b), (a+b) of the outputs (a−b)$^2$, (a+b)$^2$ from the first and second squaring circuits 7, 8, a second subtracting circuit 13 which subtracts the outputs from the first and second square root circuits 11, 12 and outputs a DC component (−2b) of the image signal component, and a coefficient calculation circuit 14 which generates a coefficient Wn whereby this subtraction output is suppressed, in other words, approaches zero, on the basis of the subtraction output (−2b) from the second subtraction circuit 13.

Next, a case is explained in which the estimated value of skew error Δt(n) produced by the calculation circuit described above includes the value b of the image signal component caused by skew error and does not include the value a of the analog input signal component. Below, the calculation formulas of the circuit elements 1 to 13 in FIG. 7 are described in sequence.

Figure 8:
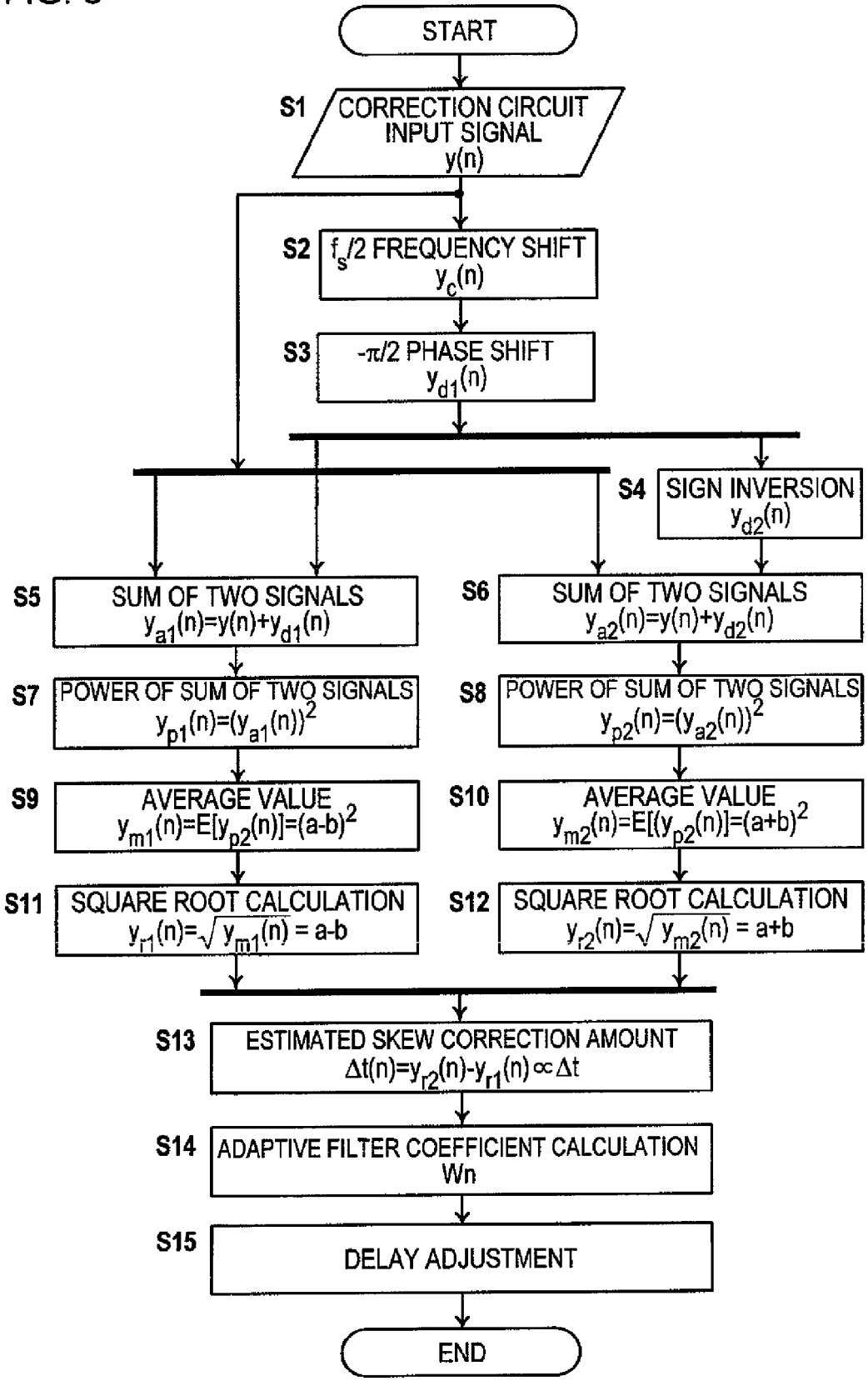
FIG. 8 is a flowchart illustrating calculation by the respective circuit elements of the correction circuit 20 in FIG. 7.

FIG. 8 is a flowchart illustrating calculation by the respective circuit elements of the correction circuit 20 in FIG. 7. The following description is also made with reference to FIG. 8.

Firstly, the digital output signal y(n) obtained by synthesizing the outputs D1, D2 of the two ADC channels 100, 200 in the adder 1 when the adaptive filter 15 is not operating will be described. This signal y(n) is the input signal which is input to the correction circuit 20.

[Adder 1 and the Calculation S1 Performed by Same]

The analog input signal A_IN to the time-interleaved ADC is, for example, the following cosine wave signal x(n).

$$x(n) = a \cdot \cos(\omega_{in} t + \theta) \tag{5}$$

Here, the DC component is as follows, and A represents the amplitude of the analogue input signal.

$$a = A/2 \quad (6)$$

In this case, the digital output signal D_OUT which is the output of the adder 1, in other words, the input signal y(n) to the correction circuit 20 includes a skew error Δt as follows.

$$y(n) = a \cdot \cos(\omega_{in} t + \theta)|_{t=nT+\Delta t/2-(-1)^n \Delta t/2} \quad (7)$$

$$= a \cdot \cos(\omega_{in}(nt + \Delta t/2 - (-1)^n \cdot \Delta t/2) + \theta$$

Here $\omega_{in}$, Δt and θ respectively express the angular frequency of the analog input signal A_IN, the skew error of the sample clock, and the initial phase.

In other words, the switches SW1, SW2 sample the analog input signal A_IN at sample points n=0 to 6, for example, at the timings, time t=0, T+Δt, 2T, 3T+Δt, 4T, 5T+Δt. Here, T=1/fs, but Δt is negative in the case depicted in FIG. 2.

Formula (7) is expressed as follows.

$$y(n) = a \cdot \cos(\omega_{in}(nT + \Delta t/2) + \theta) \cdot \cos((-1)^n \cdot \omega_{in} \cdot \Delta t/2) + \quad (8)$$
$$a \cdot \sin(\omega_{in}(nT + \Delta t/2) + \theta) \cdot \sin((-1)^n \cdot \omega_{in} \cdot \Delta t/2)$$
$$= a \cdot \cos(\omega_{in}(nT + \Delta t/2) + \theta) \cdot \cos(\omega_{in} \cdot \Delta t/2) +$$
$$a \cdot \sin(\omega_{in}(nT + \Delta t/2) + \theta) \cdot \cos(n\pi) \cdot \sin(\omega_{in} \cdot \Delta t/2)$$

Since $2\pi = \omega_s T$, then the relationship $n\pi = \omega_s nT/2$ is established, and therefore if this is substituted for $n\pi$ in Formula (8), the formula is expanded as described below.

$$y(n) = a \cdot \cos(\omega_{in} \cdot \Delta t/2) \cdot \cos(\omega_{in}(nT + \Delta t/2) + \theta) + \quad (9)$$
$$a \cdot \sin(\omega_{in} \cdot \Delta t/2) \cdot \sin(\omega_{in}(nT + \Delta t/2) - \omega_s nT/2 + \theta)$$
$$y(n) = a \cdot \cos(\omega_{in} \cdot \Delta t/2) \cdot \cos(\omega_{in}(nT + \Delta t/2) + \theta) -$$
$$a \cdot \sin(\omega_{in} \cdot \Delta t/2) \cdot \sin((\omega_s/2 - \omega_{in})nT - \omega_{in}\Delta t/2 - \theta)$$

Here, $\omega_{in}$ is the angular frequency of the input signal.

Here, since $|\omega_{in} \cdot \Delta t/2t| \ll 1$, then the following relationships are established.

$$\cos(\omega_{in} \cdot \Delta t/2) \cong 1 \quad (10)$$

$$\sin(\omega_{in} \cdot \Delta t/2) \cong \omega_{in} \cdot \Delta t/2 \quad (11)$$

Therefore, if Formulas (10) and (11) are substituted into Formula (9), then the input signal y(n) is derived as follows.

$$y(n) = a \cdot \cos(\omega_{in}(nT + \Delta t/2) + \theta) - \quad (12)$$
$$a \cdot \omega_{in} \cdot \Delta t/2 \cdot \sin(\omega_{in}(\omega_s/2 - \omega_{in})nT - \omega_{in}nT/2 - \theta)$$
$$= a \cdot \cos\alpha - b \cdot \sin\beta$$

Here, a, b, α, β are as follows:

$$a = A/2 \quad (6)$$

$$b = (A \cdot \omega_{in} \cdot \Delta t)/4 \quad (13)$$

$$\alpha = \omega_{in} nT + \omega_{in} \Delta t/2 + \theta \quad (14)$$

$$\beta = (\omega_s/2 - \omega_{in})nT - (\omega_{in}\Delta t)/2 - \theta \quad (15)$$

The first term and second term on the right-hand side of Formula (12) respectively represent the analog input signal component (a·cos α) and the image signal component (−b·sin β) corresponding to the error caused by skew. As depicted in the lower portion of FIG. 3 and the spectrum in FIG. 5(1), the analog input signal (a·cos α) has the frequency fin of the analog input signal. On the other hand, the image signal component (−b·sin β) due to skew error has a frequency (fs/2−fin) of frequency fs/2, which is ½ the sampling frequency, minus the input frequency fin.

In the following calculation, a value proportional to −b which is the DC component of the image signal component (−b·sin β) is extracted from the input signal y(n) in Formula (12), as the image error Δt.

[Frequency Shift Circuit 2, S2]

The frequency shift circuit 2 shifts the frequency of the input signal y(n) to the skew correction circuit, which is expressed in Formula (12), by fs/2. $f_s$ is the sampling frequency of the time-interleaved ADC, and hence the frequency fin in the first term of Formula (12) becomes fin−fs/2 and the frequency fs/2−fin in the second term becomes −fin. Therefore, if this frequency shifted signal is taken to be $y_c$(n), then it is expressed as follows.

$$y_c(n) = a \cdot \cos\beta + b \cdot \sin\alpha \quad (16)$$

More specifically, by shifting the frequency in Formula (12) by $f_s/2$, in Formula (16), it is possible to substitute the values α and β of the AC components cos α and sin β in the first term and the second term of Formula (12). This means that FIG. 5(1) is converted to the relationship in FIG. 5(2).

In FIG. 7 the frequency shift circuit 2 is a multiplier which multiplies the output y(t) of the adder 1 by $(-1)^n$. In order to shift the frequency by $f_s/2$, the signal y(t) is multiplied by $\cos(2\pi fs/2 \cdot t)$, but at the sampling points t=0, 1/fs, 2/fs, 3/fs to n/fs, $\cos(2\pi fs/2 \cdot t)$ is equal to cos 0, cos π, cos 2π, cos 3π to cos(nπ), and thus has a value of +1, −1, +1, −1, and so on, which means that $\cos(2\pi fs/2 \cdot t) = (-1)^n$.

[Phase Shift Circuit 3, S3]

The phase shift circuit 3 shifts the frequency shifted signal $y_c$(n) in Formula (16) by −π/2. If this phase shifted signal is taken as $y_{d1}$(n), then the following relationship is established.

$$y_{d1}(n) = a \cdot \sin\beta - b \cdot \cos\alpha \quad (17)$$

In other words, by shifting the phase of the signal $y_c$(n) in Formula (16) through −π/2, the sin function is changed to cos and the cos to sin. By this means, as indicated below, it is possible to extract the b value by adding, subtracting and respectively squaring Formula (16) and (17), and then averaging to remove the AC component and subtracting the signals from each other.

[Sign Inverter 4, S4]

The sign inverter 4 inverts the sign of the phase shifted signal $y_{d1}$(n) in Formula (17). If the signal thus obtained is taken as $y_{d2}$(n), then the following expression is obtained.

$$y_{d2}(n) = -a \cdot \sin\beta + b \cdot \cos\alpha \quad (18)$$

[Adder 5, S5]

The adder 5 adds together the input signal y(n) in Formula (12) and the phase shift signal $y_{d1}$(n) in Formula (17). If the signal thus obtained is taken as $y_{a1}$(n), then the following expression is obtained.

$$y_{a1}(n) = (a-b) \cdot \cos\alpha + (a-b) \cdot \sin\beta \quad (19)$$

[Adder 6, S6]

The adder 6 adds together the input signal y(n) in Formula (12) and the sign inverted signal $y_{d2}$(n) in Formula (18). If the signal thus obtained is taken as $y_{a2}(n)$, then the following expression is obtained.

$$y_{a2}(n)=(a+b)\cdot\cos\alpha-(a+b)\cdot\sin\beta \quad (20)$$

In other words, a subtracter is constituted by the sign inverter 4 and the adder 6.

[Squaring Circuit 7, S7]

The squaring circuit 7 squares the addition signal $y_{a1}(n)$ in Formula (19). If this squared signal is taken as $y_{p1}(n)$, then the following expression is obtained.

$$y_{p1}(n)=(y_{a1}(n))^2=(a-b)^2\{(\tfrac{1}{2})\cdot(\cos 2\alpha-\cos 2\beta)+1-\sin(\alpha-\beta)\} \quad (21)$$

Accordingly, $y_{p1}(n)$ includes $(a-b)^2$ and an AC component which is proportional to $(a-b)^2$.

[Squaring Circuit 8, S8]

The squaring circuit 8 squares the addition signal $y_{a2}(n)$ in Formula (20). If this squared signal is taken as $y_{p2}(n)$, then the following expression is obtained.

$$y_{p2}(n)=(y_{a2}(n))^2=(a+b)^2\{(\tfrac{1}{2})\cdot(\cos 2\alpha-\cos 2\beta)+1+\sin(\alpha-\beta)\} \quad (22)$$

Accordingly, $y_{p2}(n)$ includes $(a+b)^2$ and an AC component which is proportional to $(a+b)^2$.

In the example in FIG. 7, the squaring circuits 7 and 8 also multiply by the step size, simultaneously. This step size is related to the least squares method adopted in the coefficient calculation circuit 14, and by setting an appropriate step size, it is possible to minimize the time taken to bring the error $\Delta t(n)$ to zero.

[Accumulator 9, S9]

The accumulator 9 is one type of integrator which accumulates the output from the squaring circuit 7, and effectively determines an average value of the squared signal $y_{p1}(n)$ in Formula (21). If this average value is taken as $y_{m1}(n)$, then the AC component of the signal $y_{p1}(n)$ will be zero when averaged, and therefore only the DC component remains and the following expression is obtained.

$$y_{m1}(n)=E[y_{p1}(n)]=(a-b)^2 \quad (23)$$

In the illustration in FIG. 7, the circuit which achieves the accumulator 9 is surrounded by a broken line. The accumulator 9 includes an adder and a delay circuit D, and accumulates input values by adding the output value of the adder delayed by the time between sample points, to the input value.

[Accumulator 10, S10]

The accumulator 10 is also an integrator which integrates the output from the squaring circuit 8, and determines an average value of the squared signal $y_{p2}(n)$ in Formula (22). If this average value is taken as $y_{m2}(n)$, then the AC component becomes zero when averaged, and therefore only the DC component remains and the following expression is obtained.

$$y_{m2}(n)=E[y_{p2}(n)]=(a+b)^2 \quad (24)$$

[Square Root Circuit 11, S11]

The square root circuit 11 calculates the root of the average value $y_{m1}(n)$ in Formula (23). If the result of this calculation is taken as $y_{r1}(n)$, then the following expression is obtained.

$$y_{r1}(n)=a-b \quad (25)$$

[Square Root Circuit 12, S12]

The square root circuit 12 calculates the root of the average value $y_{m2}(n)$ in Formula (24). If the result of this calculation is taken as $y_{r2}(n)$, then the following expression is obtained.

$$y_{r2}(n)=a+b \quad (26)$$

[Subtracting Circuit 13, S13]

The subtracting circuit 13 determines an estimated skew correction value from the difference between the results $y_{r1}(n)$ and $y_{r2}(n)$ of the two square root calculations in Formulas (25) and (26). If this estimated amount of correction is taken as $\Delta t(n)$, then the following expression is obtained from Formula (13).

$$\Delta t(n)=y_{r2}(n)-y_{r1}(n)=2b=(A\cdot\omega_{in}\cdot\Delta t)/2\propto\Delta t \quad (27)$$

As illustrated in Formula (27), a value $2b$ proportional to the skew error $\Delta t$ is calculated. This value $2b$ includes the DC component b of the image signal component in Formula (13), but does not include the value a of the analog input signal component in Formula (12).

[Coefficient Calculation Circuit 14, S14]

Therefore, the coefficient calculation circuit 14 determines the coefficient of the N-tap adaptive filter 15, $w_n=[w_n(0), w_n(1), \text{to } w_n(N-1)]^T$. A least squares method is used to determine this coefficient.

$$w_n(i)=-\sin(\pi\times\Delta t(n))/\pi(((N-1)/2-i)-\Delta t(n)) \quad (28)$$

[Adaptive Digital Filter 15, S15]

In the adaptive filter 15, the coefficient of the adaptive filter is changed as in Formula (28) and the output signal from the second channel ADC 200 is corrected to the value of a waveform delayed by the skew $\Delta t(n)$. In other words, the waveform ch-2 in FIG. 3 is corrected to the waveform ch-1.

By repeating the processes in S1 to S15 described above, the skew error $\Delta t(n)$ is made to approach zero. In this case, the estimated skew error $\Delta t(n)$ is a value that is proportional to the value b, which is the DC component of the image signal component, only, and does not include a value a of an analogue input signal component. Consequently, even if the frequency of the analog input signal is fs/4, it is possible to make the image signal component only approach zero, and therefore the ADC according to the present embodiment may be applied to an analog input signal having a broad frequency.

The correction circuit 20 in FIG. 7 operates in synchronism with the sampling clock SCLK. In other words, the calculations described above are carried out respectively in relation to the digital values D1, D2 converted from the analog values respectively sampled by the two ADC channels, the estimated skew error value $\Delta t(n)$ is extracted, and the filter coefficient $w_n$ is calculated.

[Second Embodiment]

Figure 9:
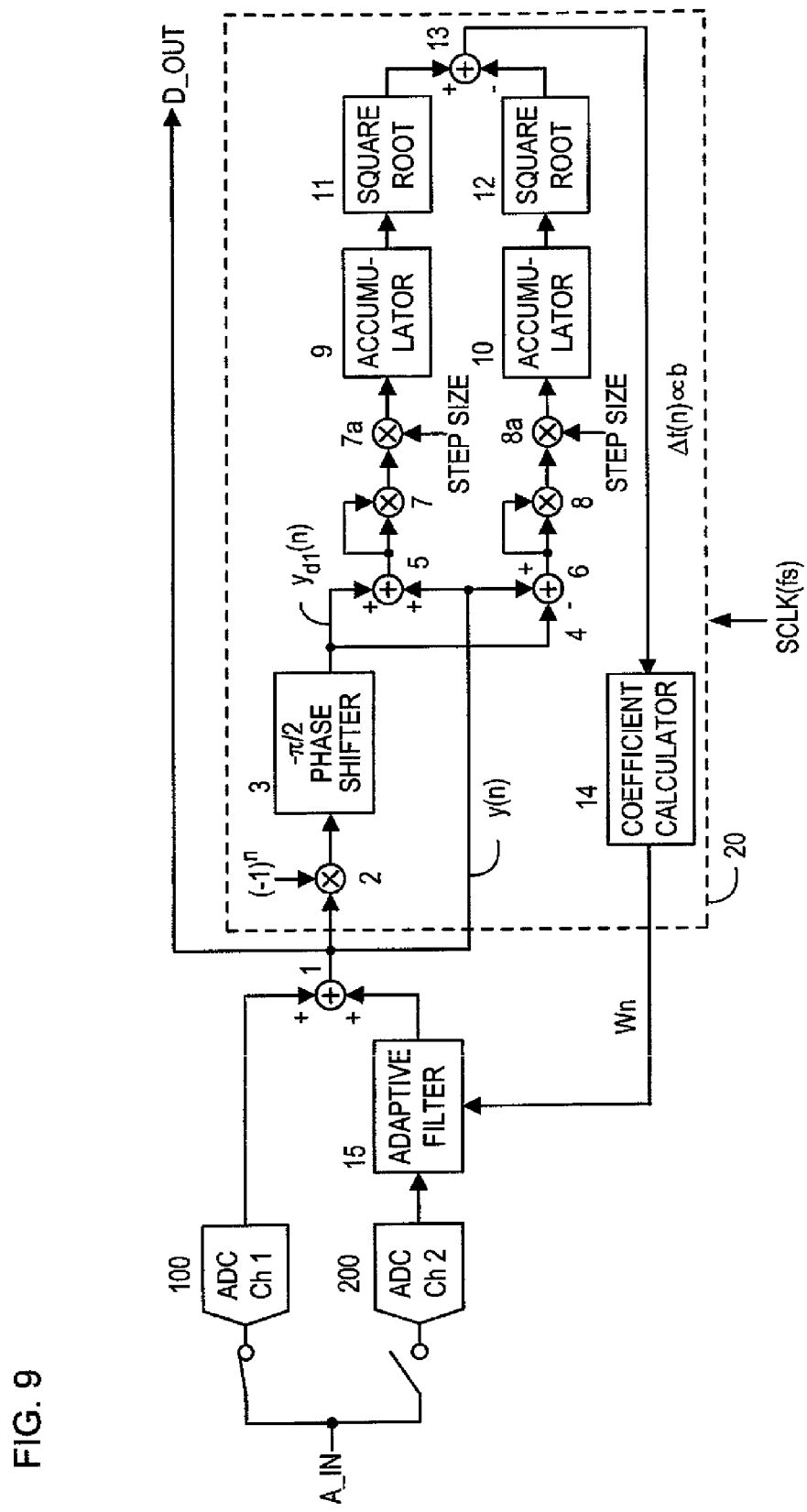
FIG. 9 is a circuit diagram of an ADC according to a second embodiment.

FIG. 9 is a circuit diagram of an ADC according to a second embodiment. Similarly to the ADC circuit in FIG. 7, the circuit has two ADC channels 100, 200, an adaptive filter 15 on the second channel side, and a correction circuit 20 for correcting the skew error. The portion of the composition which differs from FIG. 7 is the fact that the correction circuit 20 has squaring circuits 7, 8 and multipliers 7a, 8a that multiply the step sizes, which are provided separately. The rest of the composition is the same as that in FIG. 7.

In other words, in the correction circuit in FIG. 9, the sum value of y(n) in Formula (12) and $y_{d1}(n)$ in Formula (17) (the output of the adder 5) and the subtraction value thereof (the output from the subtracter 4, 6) are respectively squared by the squaring circuits 7, 8, these values are multiplied by the step size in the multipliers 7a, 8a, and the results are respectively accumulated by the accumulators 9, 10 to determine average values. The square root circuits 11, 12 then perform a root calculation of the respective average values (calculation to determine the square root), thus deriving $y_{r1}(n)=a-b$, $y_{r2}(n)=a+b$, and the subtracter 13 finds $2b$.

The coefficient calculation circuit 14 determines the coefficient $w_n$ in such a manner that this value $2b$ approaches zero, and sets this value of $w_n$ in the adaptive filter 15. By repeating the process described above, it is possible to bring the b value which corresponds to the skew error, to zero. The correction circuit 20 operates in synchronism with the sampling clock SCLK, but the coefficient calculation circuit 14 may update the coefficients after each plurality of clock intervals.

[Third Embodiment]

Figure 10:
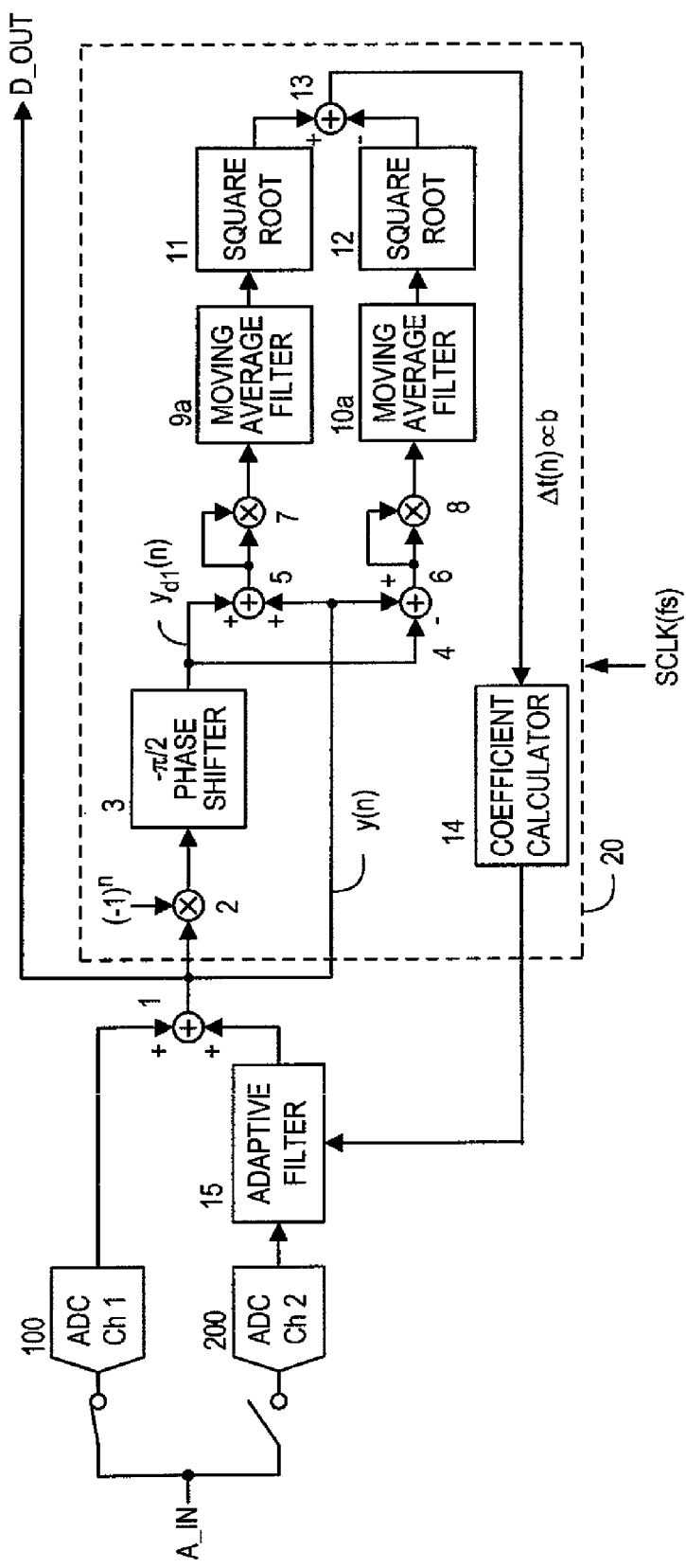
FIG. 10 is a circuit diagram of an ADC according to a third embodiment.

FIG. 10 is a circuit diagram of an ADC according to a third embodiment. In this ADC circuit, the correction circuit 20 has moving average filter circuits 9a, 10a instead of the step size multipliers 7a, 7b and accumulator 9, 10 in FIG. 9. The remainder of the composition is the same.

The moving average filter circuits 9a, 10a are circuits which determine an average value during a predetermined time period. Therefore, an average value at a predetermined past sampling point is determined in respect of the values $y_{p1}(n)$, $y_{p2}(n)$, which are the outputs from the squaring circuits 7, 8. By setting an optimal number of average value sampling points, it is possible to minimize the convergence time of the least squares method implemented by the coefficient calculation circuit 14, and hence a result corresponding to the step size setting in FIG. 9 will be achieved.

[Fourth Embodiment]

Figure 11:
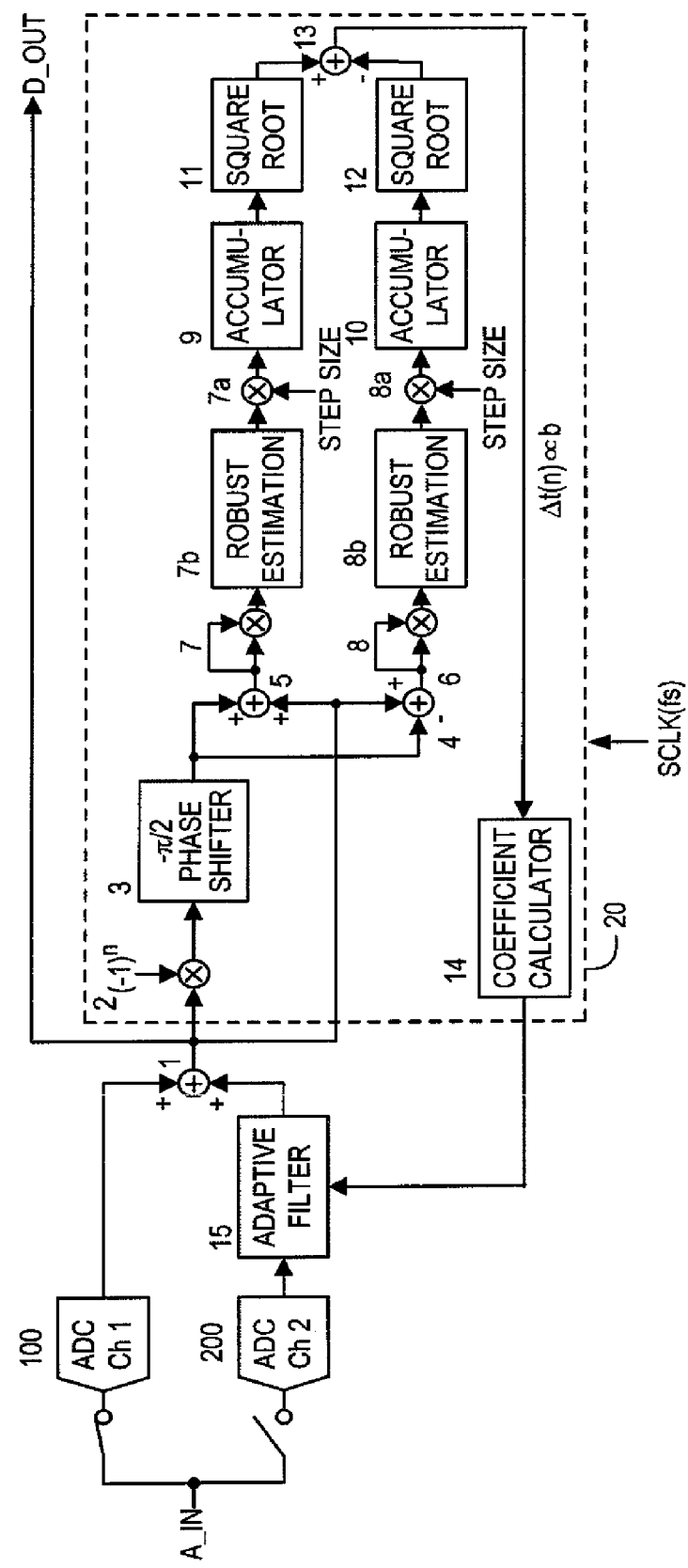
FIG. 11 is a circuit diagram of an ADC according to a fourth embodiment.

FIG. 11 is a circuit diagram of an ADC according to a fourth embodiment. In this ADC circuit, the correction circuit 20 has robust estimation circuits 7b, 8b between the squaring circuits 7, 8 in FIG. 9 and the step size multipliers 7a, 8a. The robust estimation circuits 7b, 8b are circuits which reduce the effects of outlying values of the signals $y_{p1}(n)$, $y_{p2}(n)$ in Formulas (21) and (22) which are the outputs from the squaring circuits 7, 8. The signals $y_{p1}(n)$, $y_{p2}(n)$ in Formulas (21) and (22) are values which oscillate above and below an ideal value, but due to the effects of noise of some kind, or the like, there may be values which lie greatly outside the values which oscillate above and below the ideal values. The robust estimation circuits are one type of smoothing circuit which reduce outlying values of this kind.

By determining the cumulative values by the accumulators 9, 10 after reducing the effects of outlying values, it is possible to bring the average value closer to the ideal value. If the effects of outlying values are not reduced, then the average value deviates slightly from the ideal value, and therefore the estimated skew error value $\Delta t(n)$ is a value that deviates from the ideal value and the skew error is not removed appropriately. By providing the robust estimation circuits 7b, 8b, it is possible to achieve correction which suppresses the effects of outlying values of this kind.

The values which have undergone robust correction are multiplied by the step size in the multipliers 7a, 8a, averaged by the accumulators 9, 10, subjected to a root calculation in the square root circuits 11, 12, and subtracted in the subtracter 13, to determine an estimated skew error value $\Delta t(n) \propto 2b$. This composition is the same as FIG. 9.

[Fifth Embodiment]

Figure 12:
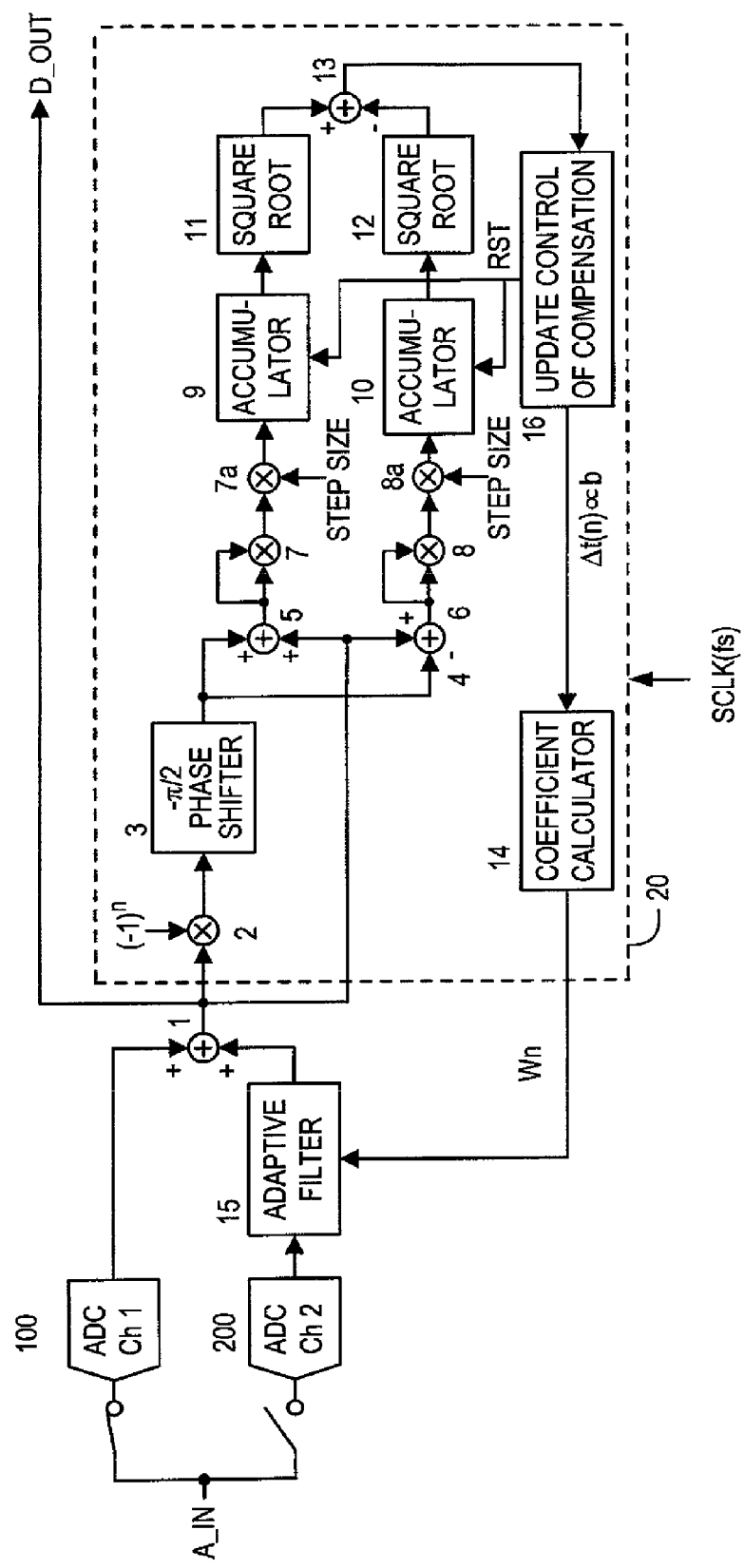
FIG. 12 is a circuit diagram of an ADC according to a fifth embodiment.

FIG. 12 is a circuit diagram of an ADC according to a fifth embodiment. The correction circuit 20 of this ADC circuit has an update control compensation circuit 16 between the subtracter 13 and the coefficient calculation circuit 14. The update control compensation circuit 16 updates the estimated skew error value $\Delta t(n)$ which is output from the subtracter 13, at each designated number of cycles of the sampling clock SCLK, for example, after every 50 sample points, and outputs this updated estimated skew error value $\Delta t(n)$ to the coefficient calculation circuit 14, while simultaneously resetting the accumulators 9, 10 with a reset signal RST.

More specifically, the update control compensation circuit 16 updates the estimated skew error value $\Delta t(n)$ which was obtained on the basis of the cumulative values of the outputs from the multipliers 7a, 8a, which are cumulated in the accumulators 9, 10, for a specified number of sample points after the coefficient $w_n$ has been set for the adaptive filter 15, to a new estimated skew error value $\Delta t(n)$. The coefficient calculation circuit 14 determines a new coefficient $w_n$ on the basis of the updated estimated skew error value $\Delta t(n)$ and sets this coefficient in the adaptive filter 15. Consequently, the effects due to the past estimated skew error value $\Delta t(n)$ are eliminated and the next estimated skew error value $\Delta t(n)$ is determined from the digital signal that has been corrected by the coefficient based on the current estimated skew error value $\Delta t(n)$. Therefore, it is possible to reduce overshoot or undershoot in approximating the estimated skew error value $\Delta t(n)$ to zero, and thus shorten the time for this approximation, by inputting the estimated skew error value $\Delta t(n)$ determined at each cycle of the sampling clock into the coefficient calculation circuit 14 so as to determine a new coefficient $w_n$. Furthermore, by selecting an appropriate update cycle, it is also possible to set a suitably large value for the step size of the multipliers 7a, 8a, and therefore further reduction in the time for approximation is achieved.

[Sixth Embodiment]

Figure 13:
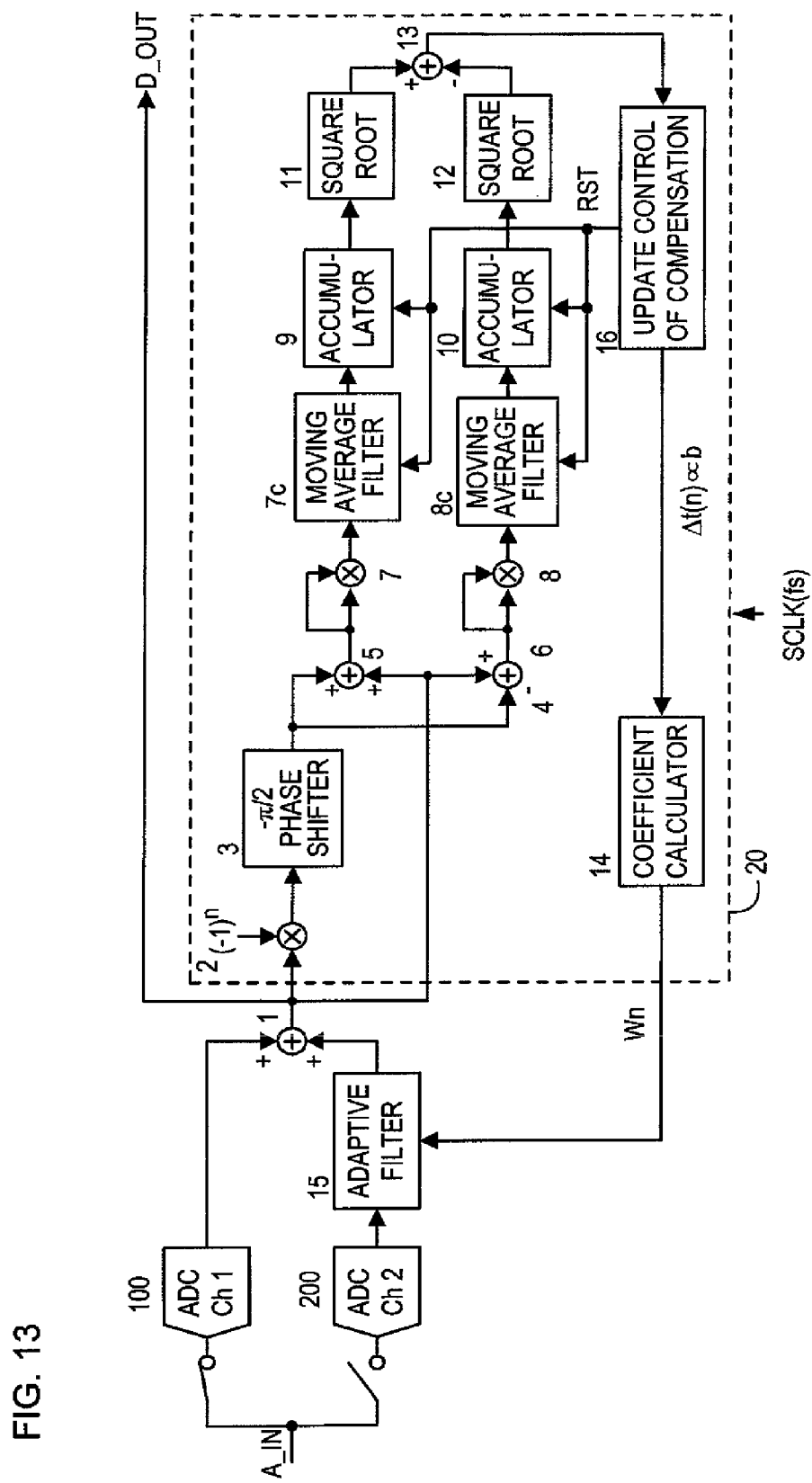
FIG. 13 is a circuit diagram of an ADC according to a sixth embodiment.

FIG. 13 is a circuit diagram of an ADC according to the sixth embodiment. The correction circuit 20 of this ADC circuit has moving average filters 7c, 8c provided between the squaring circuits 7, 8 and the accumulators 9, 10, and also includes an update control compensation circuit 16. The moving average filters 7c, 8c determine the average value of the values of a predetermined number of samples. This average value is accumulated by the accumulators 9, 10. The moving average value is one type of smoothed value, and has a similar action and effects to the robust correction by the robust estimation circuits 7b, 8b in FIG. 11. By averaging the smoothed values in the accumulators 9, 10, the outputs of the accumulators 9, 10 are values close to the ideal values.

The moving average filters 7c, 8c in FIG. 13 set values corresponding to the step size in FIG. 11. By suitably adjusting the size of the moving average values with the stop size, it is possible to shorten the time taken for approximation by the least squares method in the coefficient calculation circuit 14.

As described above, according to the ADC of the embodiment described above, the digital output signal y(n) obtained by synthesizing the digital outputs of a plurality of ADC channels is calculated, the values (a−b) and (a+b) which include the value a of the analog input signal component and the value b of the image signal component are determined, and these values are subtracted to remove the value a of the analog input signal component, and extract the value b of the image signal component. A coefficient $w_n$ is determined by a least squares method on the basis of the value b of the image signal component, and this coefficient is set in the adaptive filter 15. The image signal component is made to approach zero by repeating this calculation of the value b of the image signal component and the calculation and setting of the coefficient $w_n$.

Consequently, it is possible to approximate the image signal component to zero appropriately, even if the frequency of the analog input signal A_IN is fs/4, which is ¼ of the sampling frequency fs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. An analog digital converter which converts an analog input signal to a digital output signal by sampling at a sampling frequency, comprising:

N analog digital converter channels each being configured to convert the analog input signal into a plurality of channel digital signals in synchronous with sampling clocks having frequency obtained by N dividing the sampling frequency;

an adaptive filter being configured to filter at least one of the plurality of channel digital signals;

a channel synthesizer being configured to synthesize the plurality of channel digital signals respectively being output through or not through the adaptive filter from the analog digital converter channels, and outputs the digital output signal; and a correction circuit being configured to generate a coefficient of the adaptive filter in accordance with the digital output signal and set the coefficient to the adaptive filter, wherein the correction circuit extracts, from among an image signal component corresponding to a skew error between the N divided sampling clocks, and an analog input signal component, both of which are included in the digital output signal, a DC component of the image signal component, and generates the coefficient of the adaptive filter on the basis of the DC component of the image signal such that the DC component of the image signal component is suppressed.

2. The analog digital converter according to claim 1, wherein the correction circuit comprises:

a frequency shift circuit which shifts a frequency of the digital output signal by frequency of N divided sampling frequency;

a phase shift circuit which shifts a phase of an output of the frequency shift circuit by $-\pi/2$;

a first adding circuit which adds the digital output signal and the output signal of the phase shift circuit;

a first subtracting circuit which subtracts the output signal of the phase shift circuit from the digital output signal;

first and second squaring circuits which respectively square the output of the first adding circuit and the output of the first subtracting circuit;

first and second averaging circuits which respectively average the outputs of the first and second squaring circuits;

first and second square root circuits which respectively calculate square roots of the outputs of the first and second averaging circuits;

a second subtracting circuit which outputs the DC component of the image signal component by subtracting the outputs of the first and second square root circuits; and a coefficient calculation circuit which generates the coefficient of the adaptive filter on the basis of a subtraction output of the second subtracting circuit so as to suppress the subtraction output.

3. The analog digital converter according to claim 2, wherein the first and second averaging circuits comprises first and second accumulators which respectively accumulate the outputs of the first and second squaring circuits.

4. The analog digital converter according to claim 3, wherein the correction circuit further comprises first and second step size multipliers, which are provided respectively between the first and second squaring circuits and the first and second accumulators, and which respectively multiply the outputs of the first and second squaring circuits by a step size; and the coefficient calculation circuit generates the coefficient of the adaptive filter by a least squares method on the basis of a subtraction output of the second subtracting circuit.

5. The analog digital converter according to claim 4, wherein the correction circuit further comprises a robust correction circuit, which is provided respectively between the first and second squaring circuits and the first and second step size multipliers, and which averages values having large error in the outputs of the first and second squaring circuits.

6. The analog digital converter according to claim 3 or 4, wherein the correction circuit further comprises an update control compensation circuit which updates the subtraction output of the second subtracting circuit, for each predetermined number of samplings, and clears an accumulated value by resetting the second accumulator for each predetermined number of samplings.

7. The analog digital converter according to claim 3, wherein the correction circuit further comprises first and second moving average circuits, which are provided respectively between the first and second squaring circuits and the first and second accumulators, and which respectively calculate the moving average value of the outputs of the first and second squaring circuits, for a predetermined number of samples; and the coefficient calculation circuit generates the coefficient of the adaptive filter by a least squares method on the basis of the subtraction output.

8. The analog digital converter according to claim 7, wherein the correction circuit further comprises an update control compensation circuit which updates the subtraction output of the second subtracting circuit, for each predetermined number of samplings, and clears an accumulated value by resetting the first and second accumulators and the first and second moving average circuits for each predetermined number of samplings.

9. The analog digital converter according to claim 2, wherein the first and second averaging circuits comprise: first and second moving average circuits which respectively calculate moving average values of a predetermined number of samples of the outputs of the first and second squaring circuits, and first and second accumulators which respectively accumulate the moving average values of the first and second moving average circuits.

10. An correction circuit for an analog digital converter which converts the analog input signal to a digital output signal by sampling at a sampling frequency, the analog digital converter having, N analog digital converter channels each being configured to convert the analog input signal to a plurality of channel digital output signals in synchronous with sampling clocks having frequency obtained by N dividing the sampling frequency;

an adaptive filter being configured to filter at least one of the plurality of channel digital signals; and a channel synthesizer being configured to synthesize the plurality of channel digital signals respectively being output through or not through the adaptive filter from the analog digital converter channels, and outputs the digital output signal, wherein the correction circuit comprising:
a first calculator being configured to extract, from among an image signal component corresponding to a skew error between the N divided sampling clocks, and an analog input signal component, both of which are included in the digital output signal, a DC component of the image signal component; and from the digital output signal; and
a second calculator being configured to generate the coefficient of the adaptive filter on the basis of the DC component of the image signal such that the DC component of the image signal component is suppressed, and set the coefficient to the adaptive filter.

11. The correction circuit according to claim 10, wherein the correction circuit comprises:
a frequency shift circuit which shifts a frequency of the digital output signal by frequency of N divided sampling frequency;
a phase shift circuit which shifts a phase of an output of the frequency shift circuit by $-\pi/2$;
a first adding circuit which adds the digital output signal and the output signal of the phase shift circuit;
a first subtracting circuit which subtracts the output signal of the phase shift circuit from the digital output signal;
first and second squaring circuits which respectively square the output of the first adding circuit and the output of the first subtracting circuit;
first and second averaging circuits which respectively average the outputs of the first and second squaring circuits;
first and second square root circuits which respectively calculate square roots of the outputs of the first and second averaging circuits;
a second subtracting circuit which outputs the DC component of the image signal by subtracting the outputs of the first and second square root circuits; and
a coefficient calculation circuit which generates the coefficient on the basis of a subtraction output of the second subtracting circuit so as to suppress the subtraction output.

12. The correction circuit according to claim 11, further comprising an update control compensation circuit which updates the subtraction output of the second subtracting circuit, for each predetermined number of samplings, and clears an accumulated value by resetting the second accumulator for each predetermined number of samplings.

13. An correction method for an analog digital converter which converts the analog input signal to a digital output signal by sampling at a sampling frequency, the analog digital converter having:
N analog digital converter channels each being configured to convert the analog input signal to a plurality of channel digital signals in synchronous with sampling clocks having frequency obtained by N dividing the sampling frequency;
an adaptive filter being configured to filter at least one of the plurality of channel digital signals; and
a channel synthesizer being configured to synthesize the plurality of channel digital signals respectively being output through or not through the adaptive filter from the analog digital converter channels, and outputs the digital output signal, the method comprising:
extracting, from among an image signal component corresponding to a skew error between the N divided sampling clocks, and an analog input signal component, both of which are included in the digital output signal, a DC component of the image signal component;
generating the coefficient of the adaptive filter on the basis of the DC component of the image signal such that the DC component of the image signal component is suppressed; and
setting the coefficient in the adaptive filter.

14. The correction method according to claim 13, wherein the correction method comprising:
shifting a frequency of the digital output signal by frequency of N divided sampling frequency;
shifting a phase of the frequency shifted signal by $-\pi/2$;
adding the digital output signal and the phase shifted signal;
subtracting the phase shifted signal from the digital output signal;
respectively squaring the signal obtained in the adding and the signal obtained in the subtracting;
respectively averaging the signals obtained in the squaring;
respectively calculating square roots of the signal generated in the averaging;
subtracting the signals generated in the square root calculating so as to generate the DC component of the image signal component; and
generating the coefficient on the basis of the DC component generated in the subtracting so as to suppress the DC component.

15. The analog digital converter according to claim 1, wherein the analog input signal has an input frequency (fin), the analog input signal component has the input frequency (fin), and the image signal component has a frequency (fs/N−fin) that the input frequency (fin) is subtracted from an N divided sampling frequency (fs/N).

16. The correction circuit according to claim 10, wherein the analog input signal has an input frequency (fin), the analog input signal component has the input frequency (fin), and the image signal component has a frequency (fs/N−fin) that the input frequency (fin) is subtracted from an N divided sampling frequency (fs/N).

17. The correction method according to claim 13, wherein the analog input signal has an input frequency (fin), the analog input signal component has the input frequency (fin), and the image signal component has a frequency (fs/N−fin) that the input frequency (fin) is subtracted from an N divided sampling frequency (fs/N).

* * * * *